United States Patent Office 3,826,721
Patented July 30, 1974

3,826,721

METHOD OF FORMING LITHIUM-DOPED GERMANIUM BODIES BY ELECTRODEPOSITION IN A FUSED LITHIUM ELECTROLYTE

Robert N. Hall, Schenectady, N.Y., assignor to General Electric Company

No Drawing. Filed Oct. 24, 1972, Ser. No. 299,921
Int. Cl. C23b *5/00*
U.S. Cl. 204—39 10 Claims

ABSTRACT OF THE DISCLOSURE

Heavily lithium-doped $N^+$ surface-adjacent regions are formed in high-purity germanium bodies by electrodeposition thereof from a bath of fused lithium salt at a temperature at which the solubility of copper in germanium is negligible.

The present invention relates to the provision of improved high-purity germanium semiconductor devices as, for example, germanium particle detectors such as gamma detectors. More particularly, the invention relates to the provision of heavily lithium doped $N^+$ regions in surface-adjacent regions of such high purity semiconductor bodies and devices. This invention was made under or in relation to a contract with the Atomic Energy Commission.

High purity germanium particle detectors as, for example, gamma ray detectors, are in essence a body of exceedingly high purity germanium material wherein a thick depletion region may be established by high reverse bias so as to be exceedingly sensitive to the passage of a small quantity of high energy particles therethrough. Basically, such devices generally include, for example, a body of high purity germanium having a relatively thick intrinsic, or near-intrinsic region with a donor or $N^+$ surface-adjacent region at one major surface thereof and an acceptor or $P^+$ surface-adjacent region at the opposite major surface thereof.

Most recent developments in the preparation of such detectors have been directed primarily to be processing of the semiconductor material germanium in order that residual or uncompensated electrically significant impurities, primarily donors and acceptors, may be reduced to the practicable minimum so as to obtain germanium having the highest purity and the greatest freedom from free charge inducing impurity states in the intrinsic or near-intrinsic region between the donor and acceptor surface-adjacent regions. As an example of such developments, processing techniques directed to the elimination of residual acceptor activators and the minimizing of residual donor activators have been disclosed and claimed in my prior patents, Nos. 3,573,108 and 3,671,330, and my co-pending application S.N. 229,490, filed Feb. 25, 1972, assigned to the assignee of this invention and incorporated herein by reference thereto.

As used herein, the terms "donor" and "acceptor" are used to identify conventional donor impurities of Group V of the Periodic Table of the Elements and conventional acceptor impurities of Group III of the Periodic Table of the Elements. Such impurities add substitutional states to the germanium and induce shallow levels very close to the conduction and valence band edges. Additionally, the interstitial impurity lithium is generally regarded as a donor impurity.

By virtue of recent advances in the state of the art of processing germanium as, for example, is illustrated by my aforementioned patents and by my aforementioned co-pending patent application, the attainment of high purity germanium as represented by concentration of approximately $10^{10}$ per $cm.^3$ of donors or acceptors which are in excess and electrically active is now readily accomplished. In order to obtain such purity, extreme caution must be maintained at all steps in the processing of the base germanium from which detector or other devices are made and also in the fabrication of such devices in order that such freedom, once attained, be maintained so that all electrically significant impurities remain below that level. A particular difficulty arises in processing which precludes the utilization of many conventional semiconductor processing techniques. Thus, copper which is well known to be a detrimental impurity in germanium due to its rapid diffusion rate and deep level properties is, therefore, of sufficient activity as to preclude the attainment of the requisite detector characteristics should it be present in concentrations of the order of the permitted donor and acceptor concentrations within the semiconductor body. In addition to the foregoing, copper is found as a residual impurity in most reagents and in many materials utilized in semiconductor fabrication. A problem thus arises in the provision of thin $N^+$ and $P^+$ regions in semiconductor particle detector devices in that processing techniques which might be utilized to form such regions are normally sources of possible copper contamination.

Accordingly, it is an object of this invention to provide improved methods for fabrication of high purity germanium devices.

A further object of the present invention is to provide improved and more reliable means for providing $N^+$ surface adjacent regions on high purity germanium bodies.

Still another object of the invention is to provide high purity germanium bodies and devices that are substantially free of copper and include electrodeposited lithium surface-adjacent regions therein.

Briefly stated, in accord with one form of practicing my invention, I provide a relatively thin heavily lithium doped $N^+$ surface adjacent region in a high purity germanium semiconductor body by the electrolytic deposition of lithium therein from a bath of fused lithium salt, preferably nitrate, which is maintained at a temperature at which the solubility of copper in germanium is negligible.

The novel features of the present invention are set forth in the appended claims. The invention itself, together with further objects and advantages thereof, may best be understood by reference to the following detailed description of the invention.

As is mentioned hereinbefore, high purity germanium is of great utility in the preparation of particle detectors, particularly gamma detectors, in which case the detector generally comprises a body of intrinsic or near-intrinsic germanium having at opposite major surfaces thereof heavily doped donor and acceptor regions or $N^+$ and $P^+$ regions, which serve as electrode members. While a plurality of different means may be utilized to achieve the $N^+$ and $P^+$ regions, a very convenient and highly useful means for providing these regions, respectively, comprises a heavily lithium doped $N^+$ region and a heavily boron doped $P^+$ region, both of the order of a few tenths millimeter in thickness. A boron doped $P^+$ region may conveniently be provided by ion implantation of boron atoms therein, or by alloy and regrowth or similar methods. The provision of a heavily doped $N^+$ region is not so readily attained. Diffusion of lithium is presently the only known method of reliably providing such regions. One difficulty encountered with lithium diffusion, however, is that it has been found that in order to obtain a uniform distribution of lithium over any given area and to make such diffusions reproducible, diffusion has to be conducted at temperatures so high, e.g., 400° C., so that such diffusion processes constitute a high risk of a resultant intolerable concentration of copper in the germanium body. As is well known to the art, lithium has a very high diffusion constant and also rapidly diffuses into germanium semiconductor bodies. Accordingly, the diffusion or other means of depositing lithium in the surface adjacent N+ region of a semiconductor body as, for example, a gamma detector, must be carefully controlled. One prior art method for such lithium deposition is by the deposition thereof in vacuo. Alternatively, a slurry of lithium in an oil suspension may be painted upon the surface of the germanium body and diffused therein for a brief time at a temperature of approximately 350–400° C. The vacuum-deposition of lithium requires expensive equipment and long periods of evacuation and bake-out to obtain the necessary vacuum in order to practice this process. The diffusion of the lithium from an oil slurry painted on the surface of the germanium, like most prior art diffusion processes, is not uniform and, hence, not reliable unless conducted at a temperature in excess of 350° C., so that it proves to be a source of copper contamination because the solubility of copper in germanium at 350° C. is comparable to the residual donor or acceptor concentration in germanium used, for example, in gamma detectors and it is virtually impossible to insure that no copper is present in all the constituents used. The use of diffusion temperatures this high, or higher, therefore results in the possibility of copper, which is ever present in the world, inadvertently becoming diffused into the N+ region along with the lithium.

Yet another method for the deposition of lithium in an N+ region on a high purity semiconductor body for use in a gamma detector is the deposition of a tutectic of potassium chloride and lithium chloride salts by electrolytic processes upon the surfaces of a germanium body and the diffusion of lithium therein at a temperature of approximately 380° C. Such a high temperature is required because the eutectic of lithium chloride and potassium chloride salt has a melting point of approximately 358° C. At the temperature in this process, however, the solubility of copper in germanium is of the order of $10^{11}$ per cm.$^3$ and the practice of this technique invariably results in the inclusion of an intolerable concentration of copper in the germanium body.

In accord with the present invention, it has been determined that the safest approach to including lithium into germanium semiconductor bodies is to provide for diffusion or other such processes to be conducted at a temperature which is below the value at which copper has a substantial solubility in germanium such that the amount of copper which may possibly diffuse into the germanium body by such processes is negligible. I have determined that at 300° C., the solubility of copper in germanium reaches the maximum value which is acceptable for the formation of optimum gamma ray detectors and that above 350° C., the solubility is intolerable. Thus, at 300° C., a concentration of approximately $10^9$ atoms of copper per cubic centimeter may be present in germanium as a contaminant as a result of any process conducted at that temperature. In accord with my invention, therefore, I deposit lithium in a heavily doped N+ surface-adjacent region by electrolysis from a fused lithium salt which has a melting point below 250° C., and preferably substantially below that, such that an appropriate amount of electrodeposition from a fused salt may occur. Preferably, in accord with my invention, I utilize lithium nitrate which has a melting temperature of 255° C. and which may be utilized as a diffusion source for lithium in the form of a molten electrolytic bath within the temperature range of approximately 255–350° C. In addition to a lithium nitrate bath, an alternative bath is that of a eutectic mixture of lithium nitrate and lithium chloride, which contains 12 mole percent of LiCl and has a somewhat lower melting point than lithium nitrate alone. Any other such eutectic mixture having a lower melting point and not containing detrimental (electrically significant) constituents is also suitable.

In such operation, the fused salt may be readily contained in a Pyrex, Vycor, or similar high-temperature glass or non-reactive metal vessel, and the electrolysis may be carried out in an air atmosphere, thus achieving the ultimate in simplicity of operation. The germanium sample is immersed in the fused salt only to a depth sufficient to obtain complete immersion of the surface which is desired to be diffused, although, if desired, the entire germanium body may be immersed. The germanium body is connected as cathode and a gold, platinum, iridium, or other nonreactive metal may be utilized as anode. Conveniently, the anode may be a suitable nonreactive metallic vessel containing the fused salt. A voltage is applied between cathode and anode so as to provide a relatively low current density through the lithium nitrate. Conveniently, a voltage of two to four volts resulting in a current density of approximately 15–30 milliamperes per cm.$^2$ is ideally suited for the electrodeposition of lithium into the immersed surface-adjacent region of the germanium body. The time of electrolytic deposition can be from 1 to 30 minutes, preferably from 5 to 15 minutes. At a given temperature, the rate of deposition of the lithium upon the surface of the germanium body is substantially linear, although the rate of the simultaneous penetration of the lithium by diffusion into the germanium follows the diffusion profiles for lithium diffusion into germanium and, as is well known in the art, is a function of temperature and is greater at higher temperatures.

In accord with a preferred embodiment of the invention, I prefer to utilize a fused lithium nitrate bath, maintained at a temperature of approximately 280–300° C., which yields a depth of penetration of lithium within the immersed germanium semiconductor body of approximately 0.2 mm. during a 30 minute electrolysis.

In accord with the present invention, as described above, electro-deposited lithium doped N+ regions have been found to be of uniform thickness and to have the requisite electrical characteristics, ideal for the fabrication of improved gamma detectors. Deposition of such N+ surface-adjacent regions is such as to preclude the inclusion of all but a negligible and electrically-insignificant amount of copper, less than $10^{10}$ per cm.$^3$ and, preferably, when conducted at the range of 280–300° C., of the order of $10^9$ per cm.$^3$, or less. The process is simple, requiring no complicated equipment. The process may be conducted in air without long times for evacuation of reaction chambers and it is remarkably susceptible of duplication with identical results, all of which make such process uniquely adapted for mass production of high quality devices.

The germanium bodies produced in accord with the aforementioned process are unique in that electrodeposited lithium is present in a thin surface-adjacent region and the bodies are uniquely free of all but a negligible quantity of copper, thus resulting in a material heretofore unavailable, from which germanium gamma detectors may readily be fabricated by the ion implantation, for example, of a P+ boron region in an opposite major surface thereof, the contacting of both major surfaces with indium at room temperature, as is well known in the art, and the encapsulation of the device.

In accord with one specific example of the practice of the present invention, a germanium wafer, prepared by multiple melting and recrystallization techniques, as described in my aforementioned patents and co-pending patent application, having a one centimeter cubed dimension, is immersed in a fused lithium nitrate bath having a volume of 50 cc. and contained in a 200 ml. Pyrex vessel and is maintained at a temperature of 300° C. by a resistance heater disposed thereunder. The germanium body is immersed 2 mm. into the fused salt and held in place by means of a vacuum chuck which readily maintains its position immobile during the electrodeposition process. The germanium body is connected as cathode and a platinum anode electrode is inserted into the fused lithium salt. An electric current source providing a current of 30 ma. is applied between the anode and cathode connections and maintained for 30 minutes. After 30 minutes, the germanium body is removed, washed in distilled water, the vertical or non-major surfaces thereof are lapped and ground approximately 0.2 mm. to remove lithium diffused laterally, after which the body is etched with white etch which is a one part hydrofluoric-three parts nitric acid mix, and again washed in distilled water. Conventional electrical testing shows that lithium atoms in a concentration of approximately $10^{16}$ per cm.$^3$ are diffused a depth of approximately 0.2 mm. into the immersed major surface of the germanium wafer and that the concentration of copper is not detectable in the germanium.

While the invention has been set forth herein with respect to specific examples and particular criteria and materials, many modifications and changes will readily occur to those skilled in the art. By the appended claims, therefore, I intend to cover all such changes and modifications as fall within the true spirit and scope of the foregoing.

What I claim as new and desire to secure by Letters Patent of the United States is:

1. The method of forming a thin lithium doped surface-adjacent region in a high purity germanium semiconductor body while concurrently maintaining a residual copper concentration of less than $10^{10}$ per cm.$^3$ which method comprises deposition therein by electrolysis from a fused lithium salt at a temperature of 350° C. or lower.

2. The method of claim 1 wherein said fused lithium salt is lithium nitrate.

3. The method of claim 2 wherein said lithium nitrate is maintained at a temperature of from approximately 255° C. to no higher than 350° C.

4. The method of claim 2 wherein said lithium nitrate is maintained at a temperature of approximately 280° C. to 300° C.

5. The method of claim 2 wherein the concentration of lithium within said surface adjacent region is approximately $10^{16}$ per cm.$^3$ and the concentration of uncompensated conduction carriers in the remainder of said germanium body is of the order of $10^{10}$ per cm.$^3$ or less.

6. The method of claim 5 wherein the concentration of residual copper atoms in said germanium body is of the order of $10^9$ per cm.$^3$ or less.

7. The method of claim 4 wherein said electrolysis produces a lithium rich surface-adjacent region of sufficient depth for forming said N+ region by electrolytic deposition for periods of approximately 1 to 30 minutes.

8. The method of claim 4 wherein said electrolysis produces a lithium rich surface-adjacent region of sufficient depth for forming said N+ region by electrolytic deposition for periods of approximately 5 to 15 minutes.

9. The method of claim 5 wherein said germanium body is high purity N-type having a concentration of uncompensated residual donors of no greater than the order of $10^{10}$ per cm.$^3$.

10. The method of claim 5 wherein said germanium body is high purity P-type having a concentration of residual uncompensated acceptors of the order of $10^{10}$ acceptors per cm.$^3$ or less.

References Cited

UNITED STATES PATENTS 3,016,313 1/1962 Pell ---------------- 148—188

HOWARD S. WILLIAMS, Primary Examiner

W. I. SOLOMON, Assistant Examiner

U.S. Cl. X.R.

148—33, 188; 317—234